Dec. 29, 1970 F. H. HILBERT ET AL 3,551,833

CIRCUIT HAVING A REDUCED NUMBER OF EXTERNAL CONNECTIONS

Filed May 1, 1969

INVENTORS.
FRANCIS H. HILBERT
TIN OHN
BY Mueller, Aichele & Rauner
ATTORNEYS.

United States Patent Office 3,551,833

Patented Dec. 29, 1970

3,551,833
CIRCUIT HAVING A REDUCED NUMBER OF EXTERNAL CONNECTIONS

Francis H. Hilbert, River Grove, and Tin Ohn, Chicago, Ill., assignors to Motorola, Inc., Franklin Park, Ill., a corporation of Illinois Filed May 1, 1969, Ser. No. 820,926
Int. Cl. H03f 3/04
U.S. Cl. 330—22 10 Claims

ABSTRACT OF THE DISCLOSURE

A multiple-stage transistor integrated-circuit audio amplifier is constructed to permit a reduction from the usual four bonding pads required to three bonding pads, so that the circuit may be mounted in a standard transistor three-lead package. This is accomplished by supplying the B+ operating potential for the amplifier through an external load resistor connected to a common B+ and signal output pad on the amplifier. This pad then is connected directly to the collector of the output amplifier transistor, and also is connected to a voltage divider including a Zener diode or a string of series-connected forward-biased diodes, across which a stabilized DC potential is developed. This stabilized potential then is utilized in the amplifier circuit as the DC operating potential therefor. The excursions of the AC output signals across the load resistor are such that the threshold potential across the Zener diode is maintained or exceeded at all times, thereby isolating the AC output signals from the DC operating potential for the amplifier.

BACKGROUND OF THE INVENTION

In the design and fabrication of integrated circuits a limiting factor to the number of circuit components and number of functions which can be accomplished in any given IC package is the number of bonding pads or external connections to the package which are provided in the standardized packages. As a consequence, it sometimes is necessary to design customized packages having more than the standard number of bonding pads or it is necessary to divide the integrated circuit into two packages, sometimes not utilizing all of the available bonding pads on one of the packages as a result.

In the design of an integrated circuit requiring four external connections or bonding pads, it would be highly desirable to reduce the number of bonding pads to three, so that the package could be mounted within any standard transistor package presently available. By doing this, substantial savings in the packaging cost of the integrated circuit could be realized.

SUMMARY OF THE INVENTION

Accordingly, it is an object of this invention to more efficiently package an integrated circuit.

It is another object of this invention to reduce the number of bonding pads required for the external connections for an integrated circuit by combining at least two of the external connections at a single bonding pad.

It is a further object of this invention to combine the DC power supply bonding pad with the output bonding pad for an integrated circuit chip in order to reduce the number of bonding pads required for the chip.

In accordance with a preferred embodiment of this invention, a multiple stage integrated circuit is supplied with DC operating potentials through an impedance to a bonding pad also connected to an output of the circuit. A voltage divider including a voltage stabilizing means is connected between the bonding pad and a source of reference potential in order to decouple the output signals from the DC operating potential supplied from the stabilizing means to the circuit elements of the integrated circuit.

DETAILED DESCRIPTION

Figure 1:
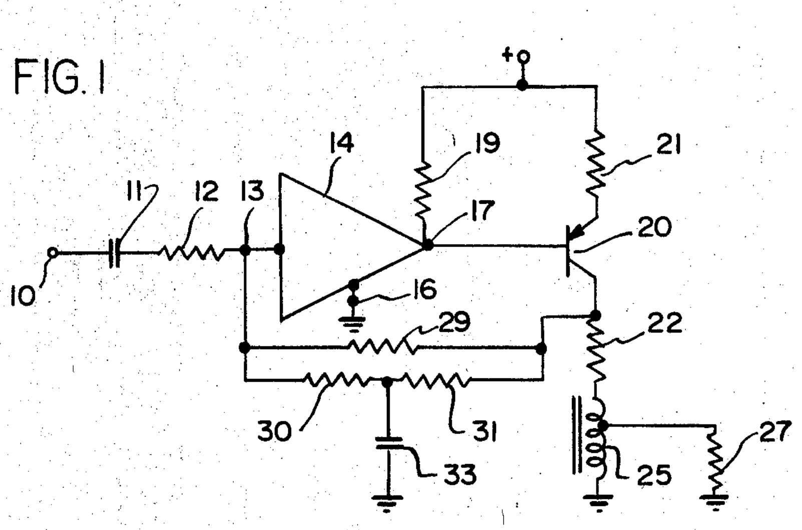
FIG. 1 is a schematic diagram of a circuit using a preferred embodiment of the invention.

Referring now to the drawing, there is shown in FIG. 1 a class A audio amplifier, utilizing an integrated circuit driver and having a choke or tapped transformer output. Input signals for the amplifier are applied to an input terminal 10 and are coupled through a coupling capacitor 11 and a resistor 12 to an input terminal or bonding pad 13 of an integrated driver amplifier circuit 14 indicated in FIG. 1 in block diagram form. The integrated circuit 14 is a preamplifier circuit and has only three external connections or bonding pads instead of the usual four which normally are required for such a circuit. In addition to the bonding pad 13 there is a ground input bonding pad 16 and a combination output and B+ voltage supply bonding pad 17. Since only three bonding pads 13, 16 and 17 are formed on the integrated circuit 14, the circuit may be mounted in a standard three-lead transistor package.

Operating potential for the integrated circuit 14 is obtained from a source of B+ and is applied through a load resistor 19 to the bonding pad 17. Output signals from the driver circuit 14 are applied from the bonding pad 17 to the base of a class A audio output PNP transistor 20, having its emitter connected through an emitter resistor 21 to the source of B+ potential. The collector of the transistor 20 is connected through a resistor 22 and a choke or tapped transformer 25 to ground potential. Amplified audio output signals then appear across a load resistor 27 connected between ground and the tap on the transformer 25.

In order to stabilize the operation of the amplifier circuit, negative DC and AC feedback is provided, with AC feedback from the collector of the transistor 20 to the input bonding pad 13 being obtained through a feedback resistor 29 of relatively high impedance. At the same time, DC feedback from the collector of the transistor 20 to the input bonding pad 13 is obtained through a pair of resistors 30 and 31 connected in series across the resistor 29. The combined resistance of the resistors 30 and 31 is substantially less than the resistance of the resistor 29, and a capacitor 33 is connected between ground and the junction of the resistors 30 and 31 in order to bypass AC signals from the path including the resistors 30 and 31.

If the DC output voltage on the collector of the transistor 20 tends to change, a corresponding change in the DC bias voltage applied to the input bonding pad 13 also occurs, resulting in a change in the drive voltage obtained from the output bonding pad 17 in a direction to compensate for the changes at the collector of the transistor 20. A comparable control for the AC signal is obtained by the feedback across the resistor 29.

Figure 2:
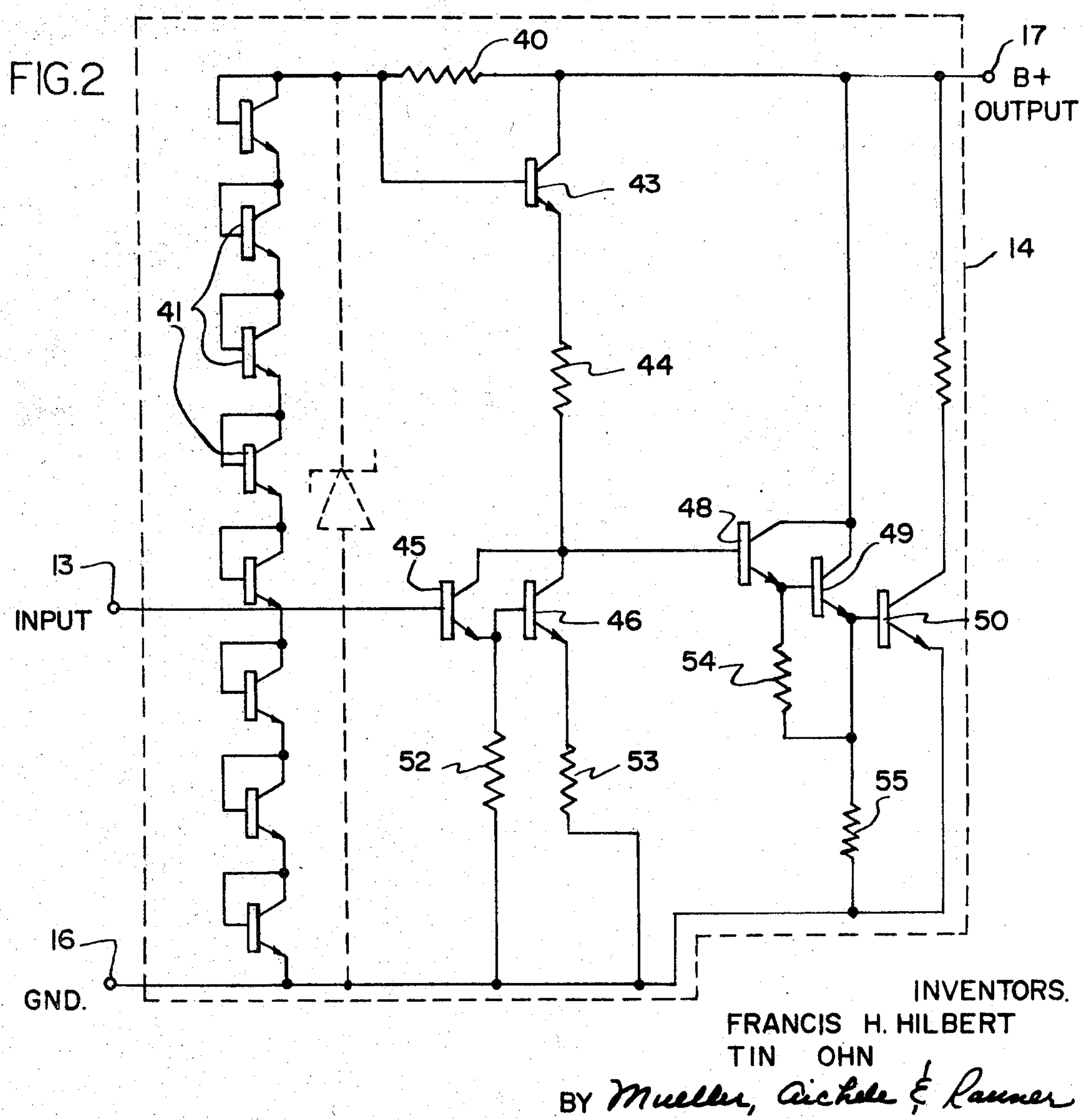
FIG. 2 is a detailed schematic diagram of an integrated circuit constructed in accordance with a preferred embodiment of the invention.

Referring now to FIG. 2, there is shown enclosed in the dotted line a detailed schematic diagram of the integrated circuit 14 of FIG. 1. The bonding pads 13, 16 and 17 shown connected to the integrated circuit 14 in FIG. 1 also are shown with the same reference numerals in FIG. 2. The DC operating potential for the circuit shown in FIG. 2 is applied to the input bonding pad 17 and through a voltage divider, consisting of a resistor 40 and a string of series connected transistor diodes 41, connected between the bonding pad 17 and the ground bonding pad 16. The transistors 41 are connected with the collector-emitter paths thereof in series and with the bases of each of the transistors connected in common to the collector, so that they operate as forward-biased diodes in the circuit shown in FIG. 2.

The desired voltage drop to be obtained across the string of diode transistors 41 is regulated by the number of transistor diodes connected in series and a stabilized reference potential appears thereacross so long as the threshold voltage of the string is exceeded by the DC potential appearing on the bonding pad 17, irrespective of any fluctuations in the potential present on the bonding pad 17. This stabilized DC reference voltage is obtained from between the junction of the diode string 41 and the resistor 40 and is applied to the base of an NPN emitter follower transistor 43, the collector of which is connected to the bonding pad 17. The emitter of the transistor 43 is connected through a resistor 44 to provide the DC operating potential for a pair of NPN input amplifier transistors 45 and 46 and for three NPN output amplifier transistors 48, 49 and 50 in the integrated circuit.

The AC input signals applied to the bonding pad 13 are applied to the base of the transistor 45, the emitter of which is connected through an emitter resistor 52 to the ground bonding pad 16. The transistor 45 is operated as a class A emitter follower and drives a second transistor 46, the emitter of which also is connected through an emitter resistor 53 to the ground bonding pad 16. The emitter follower stage 45 is utilized in order to obtain maximum gain from the input stage of the integrated circuit amplifier and to prevent loading of the input signals applied to the bonding pad 13. Amplified signals from the collector of the transistor 46 are applied to the base of the emitter follower transistor 48, the emitter of which is connected through a pair of resistors 54 and 55 to the ground bonding pad 16. As in the case of the transistor 45, the transistor 48 is utilized to prevent loading of the output transistor 46 in the first stage and to obtain maximum voltage gain from that stage of the amplifier.

The output of the emitter follower transistor 48 then drives the common emitter voltage amplifier 49, the emitter of which is connected through the resistor 55 to the ground terminal bonding pad 16, with the emitter of the transistor 49 being used to drive a voltage amplifier transistor 50, which constitutes the output amplifier of the integrated circuit pre-amplifier stage 14 shown in FIG. 2. Amplified output signals from the integrated circuit 14 of FIG. 2 are supplied from the collector of the transistor 50 to the bonding pad 17 to control the operation of the power amplifier transistor 20 shown in FIG. 1.

As stated previously in conjunction with the description of FIG. 1, negative AC and DC feedback signals are applied from the output of the collector of the transistor 20 to the input bonding pad 13 in order to stabilize the operation of the integrated amplifier circuit 14.

In conjunction with the circuit shown in FIG. 2, it should be noted that the string of forward-biased series-connected transistor diodes 41 could also be replaced with a Zener diode connected between the resistor 40 and the ground bonding pad 16 and having the desired stabilized voltage drop characteristic thereacross. The operation of the circuit is the same irrespective of whether or not the string of series-connected diode transistors 41 are used or a Zener diode is used in the circuit.

Whichever type of device is used for the voltage stabilization, however, it should be noted that the AC audio signals applied from the collector of the transistor 50 to the output bonding pad 17 are of such a nature that the negative excursions thereof do not cause the voltage at the bonding pad 17 to drop below a value which would be below the threshold value of the diode string 41 or the Zener diode. So long as the fluctuations of the signal appearing on the bonding pad 17 due to the amplification of the audio signals by the transistor 50 are above the threshold level of the string of series connected transistor diodes 41, the DC operating level for the remainder of the circuit is stabilized. Thus, the bonding pad 17 may be used to combine the function of the B+ supply terminal and the output terminal for the integrated circuit chip 14. As a consequence, a savings in one bonding pad is effected, since it no longer is necessary to have a separate bonding pad for the B+ supply and for the AC audio output of the amplifier circuit.

The frequency response for the integrated circuit audio driver amplifier shown in FIG. 2 and for the power amplifier 20 is within ±1 db from 100 Hz. to 10 kHz., and it is within ±2 db from 20 Hz. to 20 kHz. Low frequency roll-off can be achieved by using a low value input capacitor 11, and high frequency roll-off or deemphasis may be obtained by shunting the input at the base of the transistor 45 with a capacitor if so desired.

Although the foregoing description has been limited to a description of an audio preamplifier stage with a common bonding pad for the B+ power supply and the audio output, it should be noted that a comparable combination of bonding pad functions for combining the B+ operating potential with an AC ouput signal also may be utilized in conjunction with other IC chips to effect a reduction in the total number of bonding pads required for integrated circuits of any size. In addition, B− power supplies, or DC supplies on the ground side of the circuit through the use of emitter follower outputs, or a DC control voltage can be combined at a common bonding pad with an AC signal, using the techniques of this invention.

What is claimed is:

1. A circuit for reducing the number of bonding pads on an integrated circuit, including in combination:

means for supplying a DC operating potential for the circuit to a bonding pad on the integrated circuit;

a stage of the integrated circuit having an AC signal terminal directly connected to the bonding pad;

a voltage divider connected between the bonding pad and a source of reference potential, the voltage divider having a device therein exhibiting a constant voltage drop thereacross so long as the voltage applied across the voltage divider exceeds a predetermined threshold voltage of the device; and means for applying the voltage obtained across the device as a DC potential for the circuit elements of the integrated circuit.

2. The combination according to claim 1 wherein the device in the voltage divider is a Zener diode.

3. The combination according to claim 1 wherein the device in the voltage divider is a series string of forward biased diode devices.

4. The combination according too claim 1 wherein the voltage divider and the constant voltage devices are integrated circuit components formed as part of the integrated circuit.

5. The combination according to claim 1 wherein the integrated circuit is an audio amplifier having at least an output stage and one other stage utilizing transistors as the active elements thereof, the transistors having base, collector, and emittter electrodes and being supplied with the DC potential appearing across the non-linear device in the voltage divider, and wherein the output electrode of a transistor of the output stage of the audio amplifier is connected to the bonding pad.

6. A multiple-stage amplifier circuit responsive to AC input signals for providing amplified AC output signals including in combination:

an amplifier output stage for providing said amplified AC output signals from an output electrode thereof;

means for supplying DC operating potentials to the amplifier circuit;

a load impedance connected between the DC supply means and the output electrode of the output stage of the amplifier;

a voltage divider including a voltage stabilizing means having a threshold voltage for providing a stabilized DC voltage connected between a source of reference potential and the junction of the output electrode with the load impedance, the excursions of the AC output signals at the output electrode being insufficient to cause the potential across the voltage stabilizing means to drop below the threshold voltage; and means for supplying the stabilized DC voltage developed by the voltage stabilizing means as a DC operating potential to the stages of the amplifier circuit.

7. The combination according to claim 6 wherein the amplifier stages include transistors having collector, emitter and base electrodes, with the DC operating potential for the collector-emitter paths thereof and for the base biasing potentials thereof being obtained from the stabilized DC voltage developed across the voltage stabilizing means.

8. The combination according to claim 7 wherein the voltage stabilizing means is a Zener diode.

9. The combination according to claim 7 wherein the voltage stabilizing means includes a string of series connected forward biased diodes.

10. The combination according to claim 7 wherein the amplifier circuit, voltage divider, and voltage stabilizing means all are formed on a single integrated circuit chip having three bonding pads for connection to said input signals, said source of reference potential and a combined DC operating potential and output electrode terminal, respectively.

References Cited

UNITED STATES PATENTS

| | | | |
|---|---|---|---|
| 3,366,889 | 1/1968 | Avins | 330—38X |
| 3,399,353 | 8/1968 | Avins | 307—303X |

OTHER REFERENCES

Estep, "Designing Tuned Amplifiers with Integrated Circuits," EEE, October 1967, vol. 15, No. 10, pp. 60–64.

Widlar, "Design Techniques for Linear Integrated Circuits," Electronic Communicator, November/December 1966, pp. 7, 8.

ROY LAKE, Primary Examiner

J. B. MULLINS, Assistant Examiner

U.S. Cl. X.R.

330—38, 40